United States Patent [19]

Yamaguchi

[11] Patent Number: 4,759,023
[45] Date of Patent: Jul. 19, 1988

[54] MONOLITHICALLY INTEGRATED SEMICONDUCTOR OPTICAL DEVICE AND METHOD OF FABRICATING SAME

[75] Inventor: Masayuki Yamaguchi, Tokyo, Japan
[73] Assignee: NEC Corporation, Tokyo, Japan
[21] Appl. No.: 816,498
[22] Filed: Jan. 6, 1986
[30] Foreign Application Priority Data Jan. 9, 1985 [JP] Japan .................................. 60-1647

[51] Int. Cl.$^4$ ...................... B44C 1/22; C03C 15/00; H01S 3/10; H01S 3/19
[52] U.S. Cl. ...................................... 372/26; 372/44; 372/46; 372/50; 372/96; 372/31; 357/16; 357/17; 437/129; 437/225; 156/662; 156/649
[58] Field of Search .................. 372/44, 50, 46, 26, 372/96, 31; 156/662, 649; 437/129, 225; 357/17, 16

[56] References Cited

U.S. PATENT DOCUMENTS

| | | | |
|---|---|---|---|
| 4,503,541 | 3/1985 | Weller et al. | 372/50 |
| 4,558,449 | 12/1985 | Gordon | 372/44 |
| 4,618,959 | 7/1986 | Mito | 372/46 |

FOREIGN PATENT DOCUMENTS

| | | | |
|---|---|---|---|
| 181588 | 10/1984 | Japan | 372/46 |
| 198786 | 11/1984 | Japan | 372/96 |

*Primary Examiner*—Eugene R. LaRoche
*Assistant Examiner*—Michael Shingleton
*Attorney, Agent, or Firm*—Sughrue, Mion, Zinn, Macpeak, and Seas

[57] ABSTRACT

In monolithically integrating at least two semiconductor optical devices such as, e.g., a combination of a DFB laser and a light modulator by using a multilayer semiconductor structure including an active layer of stripe form, a mesa stripe which lengthwise incorporates a portion of the active stripe is formed between and contiguous to adjacent two optical devices. The mesa stripe has neither an electrode nor a contact layer, and the multilayer structure is partially removed to expose a layer directly beneath the active layer. By this construction electrical insulation between the optical devices becomes sufficient while optical connection is established by the active stripe in the mesa stripe. The mesa stripe can easily be formed by initially preparing the multilayer semiconductor structure with a channel-like depression in the uppermost layer so as to extend above and parallel to the active stripe, once filling up the depression with a portion of a contact layer, and etching unnecessary regions of the multilayer semiconductor structure by using the contact layer in the depression as a mask.

10 Claims, 2 Drawing Sheets

MONOLITHICALLY INTEGRATED SEMICONDUCTOR OPTICAL DEVICE AND METHOD OF FABRICATING SAME

BACKGROUND OF THE INVENTION

This invention relates to a monolithically integrated semiconductor optical device which may comprise a semiconductor laser and a method of fabricating the same.

A type of semiconductor lasers called distributed feed-back laser diodes (DFB LD's) are promising as light sources for long-distance and high-capacity optical fiber communication systems because each DFB LD oscillates at a single wavelength by utilizing distributed feed-back and wavelength selectivity of a diffraction grating formed within the semiconductor structure of the LD. In principle a DFB LD can easily be integrated with other kinds of optical devices because, unlike the conventional Fabry-Perot type semiconductor lasers, DFB lasers do not need cleavage surfaces. Accordingly DFB LD's are condsidered to be promising also as light sources for integrated optical circuits.

An example of integration of a DFB LD with another optical device is the monolithically integrated DFB LD device reported by M. Yamaguchi et al. at a National Meeting of Institute of Electronics and Communication Engineers of Japan, Light-and-Radio Section, Autumn 1984, lecture papers part II, No. 272. This device employs a double-channel-planar-buried-heterostructure (DC-PBH) and is comprised of a first region formed with a diffraction grating in a light guide layer adjacent an active layer in the DC-PBH wafer and a second region wherein the light guide layer has no diffraction grating. Separate electrodes are formed on these two regions. The first region is excited to operate as a DFB laser and the second region is operated as a modulator. This integrated device was produced primarily for the purpose of suppressing chirping of emitted wavelength, which is liable to occur when a conventional DFB LD is subjected to direct modulation by reason of fluctuation of the carrier density in the active layer. The purpose is accomplished by operating the DFB laser region with a constant drive current to make stationary oscillation and by using the modulator region for amplitude modulation of the laser light.

However, the reported integrated optical device suffers from insufficiency of electrical insulation between the DFB laser region and the modulator region. That is, the resistance between the electrodes on the respective regions is as low as about 50Ω since in this device electrical insulation is provided merely by removing a p+-InGaAsP cap layer in a region between the two electrodes. Therefore, a portion of the injection current for the modulator leaks into the DFB laser region and causes a change in the lasing wavelength of the DFB laser. For this reason the operation characteristics of the integrated device are not always satisfactory.

Importance of electrical insulation is not specific to the case of integrating a DFB LD with a modulator. In general, integration of a plurality of optical devices shoud be made so as to establish sufficient electrical insulation between the respective devices. For example, considering that in representative semiconductor optical devices such as laser diodes the terminal voltages are at the level of 1.5–2V, electric resistance of at least 2KΩ is necessary for limiting the amount of leak-in current to 1 mA or less. Despite enhancement of electrical insulation, good optical connections must be established between the integrated devices.

SUMMARY OF THE INVENTION

It is an object of the present invention to provide a monolithically integrated semiconductor optical device in which good optical connection and sufficient electrical insulation are established between the integrated functional devices.

It is another object of the invention to provide a simple and practically favorable method of fabricating an integrated semiconductor optical device according to the invention.

This invention provides a monolithically integrated semiconductor optical device comprising a body of a multilayer semiconductor structure including an active layer which is in the form of a stripe and has the function of emitting, absorbing or waveguiding light. The body comprises at least two functional regions which are arranged distant from each other such that the active stripe extends in each of said at least two functional regions. Each functional region has an electrode formed on its outermost layer. The body further comprises a mesa stripe which is formed between and coutiguous to said at least two functional regions and lengthwise incorporates a portion of the active stripe, and the multilayer semiconductor layer is partially removed such that a semiconductor layer directly beneath the active layer is exposed in regions sideways contiguous to the mesa stripe.

For example, the multilayer semiconductor structure employed in this invention is a DC-PBH structure and, also for example, one of the functional regions is a DFB LD and another a light modulator.

In an integrated semiconductor optical device according to the invention, the active stripe which extends in the aforementioned mesa stripe provides good optical connection between two adjacent functional regions. On the other hand, electrical insulation between these functional regions becomes sufficiently high because there is no path of current other than a stripe of a certain layer such as an embedding layer remaining unremoved in the mesa stripe which is fairly narrow in width.

A method according to the invention for fabricating the above stated integrated semiconductor optical device comprises the steps of preparing a body of a multilayer semiconductor structure, which includes an active region in the form of a stripe, such that an uppermost layer thereof is formed with a channel-like depression which extends above and parallel to the active stripe, forming a contact layer of different material from that of the uppermost layer on the uppermost layer so as to fill up the depression and so as to provide a flat upper surface, forming at least two separate electrodes on the contact layer so as to be spaced from each other in the longitudinal direction of the active stripe, etching the contact layer in every region intervening between said at least two electrodes so as to leave the contact layer unremoved only in the aforementioned depression, next etching the multilayer semiconductor structure in every region between said at least two electrodes by using the contact layer remaining in the depression as an etching mask so as to form a mesa stripe with its top face covered with the contact layer remaining in the depression and so as to expose a semiconductor layer directly beneath the active region in regions sideways contiguous to the mesa stripe, and thereafter removing the contact layer remaining in the depression.

The fabrication method according to the invention is based on the following knowledge, analysis and consideration.

For example, in the case of monolithically integrating a semiconductor laser using an n-type semiconductor substrate with another semiconductor optical device, the desire to make the electrical resistance between the two optical devices sufficiently high while maintaining good optical connection can be met by removing p-type semiconductor layers as much as possible so as to leave the active layer having the function of waveguiding light together with nearby semiconductor layers in the form of a mesa stripe. In general, resistivity of a p-type semiconductor such as InP is about 0.1Ω-cm when the carrier concentration is of the order of $1 \times 10^{18}$ cm$^{-3}$. Assuming that the distance between the two optical devices is 20 μm and the thickness of the p-type semiconductor layers above the active layer is 2 μm, the resistance between the two devices becomes higher than 2 kΩ if the width of the aforementioned mesa stripe is limited to 5 μm or less. Usually a very high-precision processing technique is required for forming a mesa stripe which is smaller than 10 μm in width and includes an about 2-μm wide active stripe in its center region. However, in the case of semiconductor optical devices characterized by the following structure the desired mesa stripe can be formed by a very simple process.

There are several types of semiconductor lasers in which the surface of a semiconductor layer laid on an active layer of a stripe form has an about 10-μm wide channel-like depression that extends parallel to the active layer, and that semiconductor layer is overlaid with a contact layer which fills up the depression and provides a flat upper surface. By uniformly etching the contact layer in such semiconductor lasers it is possible to leave the contact layer only in the depression with a width of from a few microns to about 10 microns. Then it is natural that the active stripe exists right below the unremoved portion of the contact layer. As a next step, it is possible to etch the multilayer semiconductor structure with a selected etchant which is ineffective for the contact layer and is effective for the underlying semiconductor layers for the purpose of the contact layer remaining in the depression as an etching mask. By etching in this manner a mesa stripe including the active stripe can be formed beneath the contact layer left unremoved and used as the mask. This process is a combination of simple etching operations and does not need a photolithography technique or the like which must include a high-precision alignment procedure. Despite such simpleness, this etching process is very good in reproducibility.

As will be understood, the integrated device construction and the fabrication method according to the invention are practicable and very effective also when integrating three or more semiconductor optical devices on a single substrate.

DESCRIPTION OF THE PREFERRED EMBODIMENTS

Figure 1:
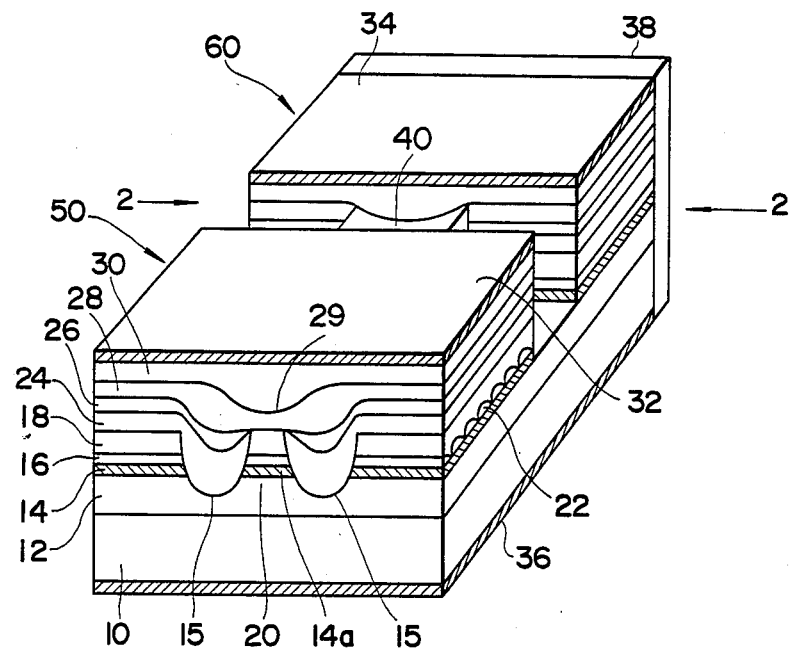
FIG. 1 is a perspective view of an integrated semiconductor optical device as an embodiment of the present invention.

As an embodiment of the invention, FIG. 1 shows a semiconductor optical device in which a DFB LD 50 and a light modulator 60 are monolithically integrated. This device utilizes a multilayer semiconductor structure comprised of an n-type InP substrate 10, an n-type InP buffer layer 12, an active layer 14 of undoped InGaAsP having 1.55 μm wavelength composition, a light guide layer 16 of p-type InGaAsP having 1.2 μm wavelength composition and an n-type InP cladding layer 18. Only in the DFB LD part 50 of the device the light guide layer 16 is formed with a diffraction grating 22 the period of which is 2400 A(angstrom).

There are two parallel channels 15 which reach the buffer layer 12 from the surface of the cladding layer 18 and extend lengthwise of the multilayer structure to provide center mesa stripes 20 of the laminated layers 12, 14, 16, 18. Except for the top face of the mesa 20, the cladding layer 18 and the surfaces exposed by the channels 15 are closely covered with a p-type InP blocking layer 24, which is overlaid with an n-type InP blocking layer 26 so as to leave the top face of the mesa 20 exposed. A p-type InP embedding layer 28 formed on the blocking layer 26 covers the top face of the mesa 20 too. The embedding layer 28 has a depression 29 right above the mesa stripes 20 and is overlaid with a p+InGaAsP contact layer 30 which provides a flat upper surface. A laser diode of such a multilayer structure is called a double-channel-planar-buried-heterostructure laser diode (DC-PBH LD).

Figure 2:
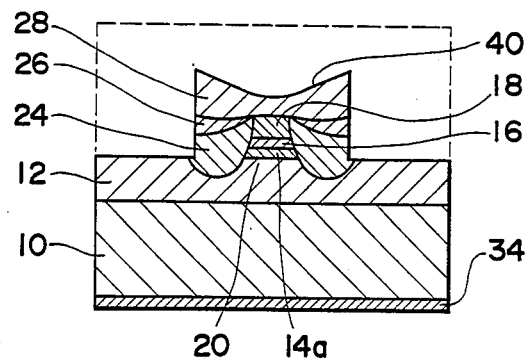
FIG. 2 is a sectional view taken along the line 2—2 in FIG. 1.

In a middle region of the above described multilayer structure the contact layer 30 is removed to provide a gap between the DFB LD part 50 and the modulator part 60. The DFB LD part 50 has a p side electrode 32 on its contact layer 30 and the modulator part 60 too has a p side electrode 34 on its contact layer 30. An n side electrode 36 common to the LD part 50 and the modulator part 60 is formed on the bottom face of the n-type InP substrate 10. In the same middle region the embedding layer 28 and the underlying blocking layers 26 and 24 are removed except their middle portions near the mesa stripes 20, as can clearly be seen in FIG. 2, so that a mesa stripe 40 extends from the LD part 50 to the modulator part 60. This mesa stripe 40 incorporates a middle portion of the precedingly formed mesa stripes 20 including a stripe 14a of the undoped InGaAsP active layer 14. On the modulator 60 side the end face of the device is provided with an antireflective coating film 38 to minimize reflection of light from the modulator part 60 to the DFB LD part 50.

In this device the electric resistance between the two electrodes 32 and 34 can be made very large since the p-type InP embedding layer 28 which contributes to electroconductivity is almost removed in the region between the two electrodes 32 and 34 except a small portion incorporated in the mesa stripe 40. For example, when the p-type InP embedding layer 28 has a carrier concentration of $1 \times 10^{18}$ cm$^{-3}$ and a thickness of 2 μm and the distance between the two electrodes 32 and 34 is 20 μm, the electric resistance between the electrodes 32 and 34 can be made greater than 1K Ω by limiting the width of the mesa stripe 40 to about 5 μm. On the other hand, good optical connection between the DFB LD part 50 and the light modulator part 60 is established by the active layer 14a of stripe shape which extends through the mesa stripe 40.

When current was injected into the DFB LD part 50 of a sample of this device, uniwavelength radiation at 1.55 μm was observed. When the modulator part 60 of the same sample was operated to perform 1 Gb/s pulse modulation of the emitted laser light, very good modulation characteristics were obtained with little chirping of the radiating wavelength.

The following is a detailed description of an exemplary process of fabricating the monolithically integrated semiconductor optical device of FIG. 1.

Figure 3A:
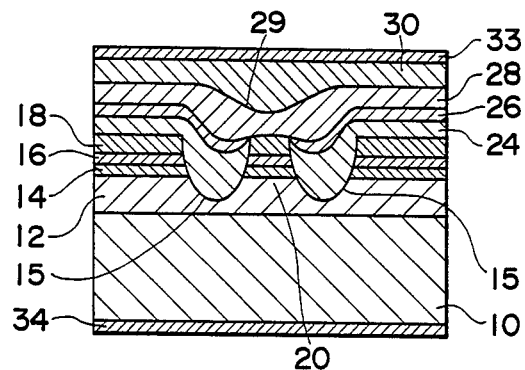
FIGS. 3(A) 3(B) and (C) illustrate a process of fabricating the device of FIG. 1 in sectional views, corresponding to FIG. 2, of intermediate structures.

Referring to FIG. 3(A), the n-type InP buffer layer 12 is epitaxially grown on the n-type InP substrate 10 to a thickness of 3 μm, and successively the undoped InGaAsP (1.55 μm wavelength composition) active layer 14 is epitaxially grown to a thickness of 0.1 μm and the p-type InGaAsP (1.2 μm wavelength composition) light guide layer 16 is grown to a thickness of 0.1 μm. After that, though not shown in FIG. 3(A), the diffraction grating 22 (period 2400 Å) shown in FIG. 1 is formed in the selected area of the surface of the light guide layer 16 by using an interference photolithographic method and a chemical etching method. Then the p-type InP cladding layer 18 is epitaxially grown on the guide layer 16 to obtain a multilayer semiconductor wafer having a flat top face. In this semiconductor wafer two 8-μm wide channels 15 are formed in a parallel arrangement to a depth greater than the total thickness of the cladding layer 18, light guide layer 16 and active layer 14 so as to form 2-μm wide mesa stripes 20 between the two channels 15. By a liquid-phase epitaxy process the p-type InP blocking layer 24 and the n-type InP blocking layer 26 are successively grown on the channels 15 and the flat region of the semiconductor wafer except the top face of the center mesa 20. In the flat region the thicknesses of the p-type blocking layer 24 and the n-type blocking layer 26 are μm and 1 μm, respectively. Also by liquid-phase epitaxy, the p-type InP embedding layer 28 is grown on the entire surface including the top face of the mesa 20 so as to have a thickness of 2 μm in the flat region, and then the p+-InGaAsP contact layer 30 to a thickness of 1 μm in the flat region. The surface of the p-type InP embedding layer 28 is formed with an approximately 10-μm wide channel-like depression 29 which extends above and along the mesa stripes 20 including the light emitting active region. However, the depression 29 is filled up by subsequent liquid-phase epitaxy growth of the p+-InGaAsP contact layer 30, which provides a flat top face. An electrode 33, which is to be divided into the two p side electrodes 32 and 34 in FIG. 1, is formed on the contact layer 30 and the n side electrode 36 on the bottom face of the substrate 10.

Figure 3B:
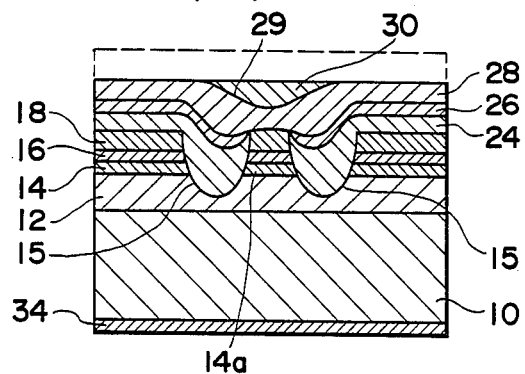

Reffering to FIG. 3(B), the electrode 33 in FIG. 3(A) is removed in a middle region which is to intervene between the DFB LD part 50 and the modulator part 60 in the completed device. In the same region the p+-InGaAsP contact layer 30 is etched with a suitable etching solution such as, for example, a 3:1:1 mixture of $H_2SO_4$, $H_2O_2$ and $H_2O$ until the surface of the embedding layer 28 is exposed in its flat region. This etching operation leaves the contact layer 30 unremoved only in the channel-like depression 29. As a natural consequence the unremoved portion of p+-InGaAsP 30 is surely located right above the stripe-shaped active layer 14a.

Figure 3C:
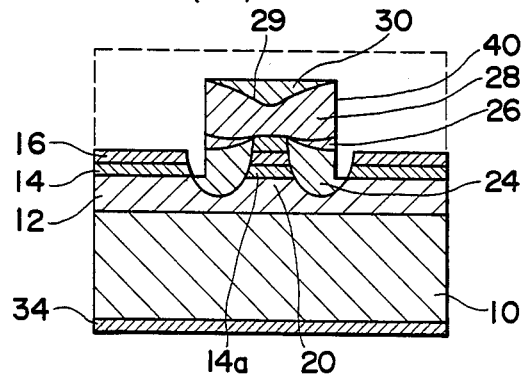

Referring to FIG. 3(C), in the aforementioned middle region the InP layers 28, 26, 24 and 18 are removed by etching with an etchant that selectively acts on InP and does not act on InGaAsP, such as HCl for example. In this etching operation the p+-InGaAsP layer 30 remaining in the depression 29 serves as an etching mask, so that the InP layers 28, 26, 24, 18 remain unremoved only in the central regions beneath the p+-InGaAsP mask layer 30 in FIGS. 3(B) and 3(C).

Next, the p+-InGaAsP layer 30 used as the etching mask is removed by using an etchant liquid that selectively acts on InGaAsP and does not act on InP, such as the aforementioned mixture of $H_2SO_4$, $H_2O_2$ and $H_2O$. By this etching operation the exposed portions of the InGaAsP light guide layer 16 and the InGaAsP active layer 14 are also removed. As the result the structure of the section shown in FIG. 3(C) turns into the structure shown in FIG. 2, which means completion of fabrication of the integrated semiconductor device of FIG. 1. By virtue of the above described fabrication process the mesa stripe 40 which bridges the gap between the DFB LD part 50 and the modulator part 60 incorporates the active layer 14a of stripe shape, and the n-type InP buffer layer 12 is exposed on both sides of the mesa stripe 40.

It is an important feature of the above described method that the stripe-shaped active layer 14a, which is about 2-μm wide in the illustrated case, is always located in a central part of the mesa stripe 40 as a natural consequence. There is no need for a high-precision alignment photolithographic technique or the like to form the mesa stripe 40 with such a positional relation to the active stripe 14a. Furthermore, in every case and without effort the width of the mesa stripe 40 falls in a narrow range of from a few μm to about 10 μm so that electrical insulation between the two optically functional parts 50 and 60 is sufficient.

The combination of the DFB LD 50 and the light modulator 60 in the above described embodiment is not limiting. For example, the second functional part 60 can alternatively be used as a light detector or a wavelength control element for the DFB LD 50. Still differently, the second functional part 60 can operate as a distributed Bragg reflector laser diode (DBR LD) by current injection for laser radiation while the first functional part 50 can be used to control the wavelength of the DBR LD.

Semiconductor laser structures other than the DC-PBH structure can also be employed in an integrated semiconductor device according to the invention. The fabrication method according to the invention is applicable to semiconductor lasers in which a depression existing above a stripe-shaped active layer is filled up with a contact layer which provides a flat upper surface. In the above described embodiment an n-type semiconductor is used as the substrate 10, but it is also possible to use a p-type semiconductor substrate accompanied by reversal of the type of conductivity of each layer in the illustrated multilayer structure. It is a matter of course that the combination of InP and InGaAsP used in the above described embodiment can be replaced by a different combination of semiconductor materials such as, for example, GaAs and AlGaAs.

What is claimed is:

1. A method of fabricating a monolithically integrated semiconductor optical device having at least two functional regions distant from each other in a multilayer semiconductor body including an active layer in the form of a stripe which extends through said at least two functional regions and through every region intervening between said at least two functional regions, the method comprising the steps of:

(a) preparing a body of a multilayer semiconductor structure, which includes said active layer in the form of said stripe, such that an uppermost layer thereof is formed with a channel-like depression which extends above and parallel to said stripe;

(b) overlaying said uppermost layer with a contact layer different in material from said uppermost layer so as to fill up said depression and so as to provide a flat upper surface;

(c) forming at least two separate electrodes on said contact layer, said at least two electrodes spaced from each other in a longitudinal direction of said stripe;

(d) etching said contact layer in said every region intervening between said at least two electrodes so as to leave said contact layer unremoved only in said depression;

(e) etching said multilayer semiconductor structure in said every region between said at least two electrodes by using said contact layer remaining in said depression as an etching mask so as to form a mesa stripe with its top face covered with said contact layer remaining in said depression and so as to expose a semiconductor layer directly beneath said active layer in regions sideways contiguous to said mesa stripe; and (f) removing said contact layer remaining on said mesa stripe.

2. A method according to claim 1, wherein the step (a) comprises the sub-steps of:

(i) preparing a multilayer semiconductor wafer by forming an active layer on a buffer layer, forming a light guide layer on said active layer, and overlaying a flat cladding layer on said light guide layer;

(ii) forming two parallel channels each of which reaches from an upper surface of said cladding layer to said buffer layer to provide said mesa stripe including said active region between said two channels;

(iii) forming blocking layers on said channels and on said cladding layer except an upper surface of the mesa stripe formed at sub-step (ii); and (iv) forming an embedding layer on said blocking layers and also on the upper surface of the mesa stripe formed at sub-step (ii) such that the upper surface of said embedding layer has said depression above the mesa stripe formed at sub-step (ii).

3. A method according to claim 2, wherein a diffraction grating is formed in said light guide layer only in a selected region above which one of said at least two electrodes is to be formed.

4. A method according to claim 1, wherein said multilayer semiconductor structure is formed of InP and InGaAsP.

5. A method according to claim 1, wherein said multilayer semiconductor structure is formed of GaAs and AlGaAs.

6. A method according to claim 1, further comprising the step of fabricating said at least two functional regions such that one of said at least two functional regions operates as a semiconductor laser.

7. A method according to claim 6, further comprising the step of fabricating said at least two functional regions such that another of said at least two functional regions operates as a light modulator.

8. A method according to claim 6, wherein said steps (a)–(f) are performed such that said semiconductor laser is fabricated as a distributed feed-back laser diode.

9. A method according to claim 8, wherein said steps (a)–(f) are performed such that said semiconductor laser is of a planar-buried-heterostructure.

10. A method according to claim 9, wherein said steps (a)–(f) are performed such that said semiconductor laser is of a double-channel-planar-buried-heterostructure.

* * * * *